(12) United States Patent
Berger et al.

(10) Patent No.: US 12,256,590 B2
(45) Date of Patent: Mar. 18, 2025

(54) LIGHT SENSOR PIXEL AND METHOD OF MANUFACTURING THE SAME

(71) Applicant: STMicroelectronics (Crolles 2) SAS, Crolles (FR)

(72) Inventors: Thierry Berger, Brignoud (FR); Stephane Allegret-Maret, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 573 days.

(21) Appl. No.: 17/543,004

(22) Filed: Dec. 6, 2021

(65) Prior Publication Data

US 2022/0181390 A1      Jun. 9, 2022

(30) Foreign Application Priority Data

Dec. 8, 2020   (FR) ........................................ 2012858

(51) Int. Cl.
| | | |
|---|---|---|
| *H01L 23/14* | (2006.01) | |
| *H10K 30/35* | (2023.01) | |
| *H10K 30/82* | (2023.01) | |
| *H10K 30/87* | (2023.01) | |
| *H10K 39/32* | (2023.01) | |

(52) U.S. Cl.
CPC ............ *H10K 39/32* (2023.02); *H10K 30/35* (2023.02); *H10K 30/82* (2023.02); *H10K 30/87* (2023.02)

(58) Field of Classification Search
CPC ........ H10K 39/32; H10K 30/35; H10K 30/82; H10K 30/87; Y02E 10/549; H01L 27/14632; H01L 27/14636; H01L 27/14665; H01L 27/14687

See application file for complete search history.

(56) References Cited

U.S. PATENT DOCUMENTS

| | | | | |
|---|---|---|---|---|
| 2011/0073750 | A1* | 3/2011 | Nagano .................. | H04N 25/76 250/208.1 |
| 2013/0009065 | A1* | 1/2013 | Okada .................... | H04N 23/30 250/363.01 |
| 2016/0178763 | A1* | 6/2016 | Okada ............... | H01L 27/14676 250/370.14 |

(Continued)

FOREIGN PATENT DOCUMENTS

| | | | | |
|---|---|---|---|---|
| EP | 1677364 A1 | 7/2006 | | |
| FR | 3114190 A1 * | 3/2022 | ....... | H01L 27/14605 |

(Continued)

OTHER PUBLICATIONS

INPI Search Report and Written Opinion for priority application, FR 2012858, report dated Jul. 1, 2021, 8 pages.

*Primary Examiner* — Samuel Park
(74) *Attorney, Agent, or Firm* — Crowe & Dunlevy LLC

(57) ABSTRACT

A pixel includes a first electrode layer on an exposed surface of an interconnection structure and in contact with a conductive element of the interconnection structure. An insulating layer extends over the first electrode layer and includes opening crossing through the insulating layer to the first electrode layer. A second electrode layer is on top of and in contact with the first electrode layer and the insulating layer in the opening. A film configured to convert photons into electron-hole pairs is on the insulating layer, the second electrode layer and filling the opening. A third electrode layer covers the film.

24 Claims, 4 Drawing Sheets

(56) References Cited

U.S. PATENT DOCUMENTS

| | | | |
|---|---|---|---|
| 2020/0227509 A1* | 7/2020 | Yoon | ........................ H10K 59/38 |
| 2021/0074744 A1* | 3/2021 | Sumida | ............... H01L 27/1461 |
| 2022/0085084 A1* | 3/2022 | Bianchi | ............... H01L 27/1462 |
| 2022/0367572 A1* | 11/2022 | Moriwaki | ......... H01L 27/14612 |

FOREIGN PATENT DOCUMENTS

| | | | |
|---|---|---|---|
| WO | 2004001853 A2 | 12/2003 | |
| WO | 2015188146 A2 | 12/2015 | |

* cited by examiner

LIGHT SENSOR PIXEL AND METHOD OF MANUFACTURING THE SAME

PRIORITY CLAIM

This application claims the priority benefit of French Application for Patent No. 2012858, filed on Dec. 8, 2020, the content of which is hereby incorporated by reference in its entirety to the maximum extent allowable by law.

TECHNICAL FIELD

The present disclosure generally concerns light sensors, for example image sensors, and, more particularly, a pixel of a light sensor and a method of manufacturing such a pixel.

BACKGROUND

Light sensors are known in the art which comprise an integrated circuit in CMOS ("Complementary Metal Oxide Semiconductor") technology, an interconnection structure resting on the integrated circuit, and a photosensitive film resting on the interconnection structure. The photosensitive film forms part of a stack arranged above the integrated circuit in an arrangement referred to in the art as an "ABove Integrated Circuit" (ABIC)-type stack. The film is configured to implement, at the operating wavelength of the sensor, the conversion of incident photons into electron-hole pairs. In such sensors, each pixel of the sensor generally comprises a portion of the photosensitive film.

There is a need to overcome all or part of the disadvantages of known light sensors, in particular of known light sensors of the above-described type.

SUMMARY

An embodiment comprises a method of manufacturing a pixel including the successive steps of: depositing a first electrode layer on an exposed surface of an interconnection structure of an integrated circuit, and in contact with a conductive element of the structure which is flush with said exposed surface; depositing an insulating layer; etching an opening crossing the insulating layer down to the first electrode layer; depositing a second electrode layer on top of and in contact with the first electrode layer and the insulating layer; removing by etching a portion of the electrode layer resting on the insulating layer; and depositing a film configured to convert photons into electron-hole pairs when a radiation at an operating wavelength of the pixel reaches the pixel.

According to an embodiment, before the deposition of the insulating layer, the method comprises an etching down to said surface while leaving in place a portion of the first layer entirely covering the conductive element.

According to an embodiment, a portion of the first electrode layer exposed by the etching of the opening and the lateral walls of the opening are entirely covered with the second electrode layer.

According to an embodiment, the film is deposited so that an exposed surface of the film is planar.

According to an embodiment, the method further comprises a next step of forming of an electrode on said film, said electrode being made of one or a plurality of materials transparent to said wavelength.

An embodiment provides a pixel comprising: a first electrode layer resting on top of and in contact with a surface of an interconnection structure of an integrated circuit of the pixel and covering a conductive element of said structure which is flush with said surface; an insulating layer comprising a through opening down to the first electrode layer; a second electrode resting on top of and in contact with the first electrode layer at the bottom of the opening and on top of and in contact with the lateral walls of said opening; and a film configured to convert photons into electron-hole pairs when a radiation at an operating wavelength of the pixel reaches the pixel, said film filling the opening and covering the second electrode layer and the insulating layer.

According to an embodiment, the pixel is obtained by an implementation of the described method.

According to an embodiment, said film comprises colloidal quantum dots.

According to an embodiment, the thickness of the insulating layer minus the thickness of the first electrode layer is equal to half of said wavelength in the material of the film.

According to an embodiment, the wavelength of the radiation is in the range from 750 nm to 3,000 nm, for example equal to 940 nm.

According to an embodiment, the first electrode layer comprises a diffusion barrier layer on top of and in contact with the conductive element.

According to an embodiment, the second electrode layer comprises a charge extraction layer configured to be in contact with said film.

According to an embodiment: the second electrode layer is thinner, for example ten times thinner, than the insulating layer; and/or the film is thicker, for example at least twice thicker, than the insulating layer.

According to an embodiment, the pixel further comprises an electrode resting on the film, the electrode being made of a material transparent to the wavelength of the radiation.

An embodiment provides a light sensor comprising at least one pixel such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the usual CMOS integrated circuits of light sensors, particularly the pixel readout CMOS integrated circuits, have not been detailed, the described embodiments, implementation modes, and variants being compatible with usual CMOS integrated circuits of light sensors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, the term operating wavelength of a light sensor or of a pixel of the light sensor designates a wavelength of a light radiation, or electromagnetic radiation, received by the sensor or the pixel for which the sensor or the pixel implements a conversion of the received photons into electron-hole pairs. A light sensor or a pixel of such a sensor may have a plurality of operating wavelengths, for example, in an operating wavelength range.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

Figure 1:
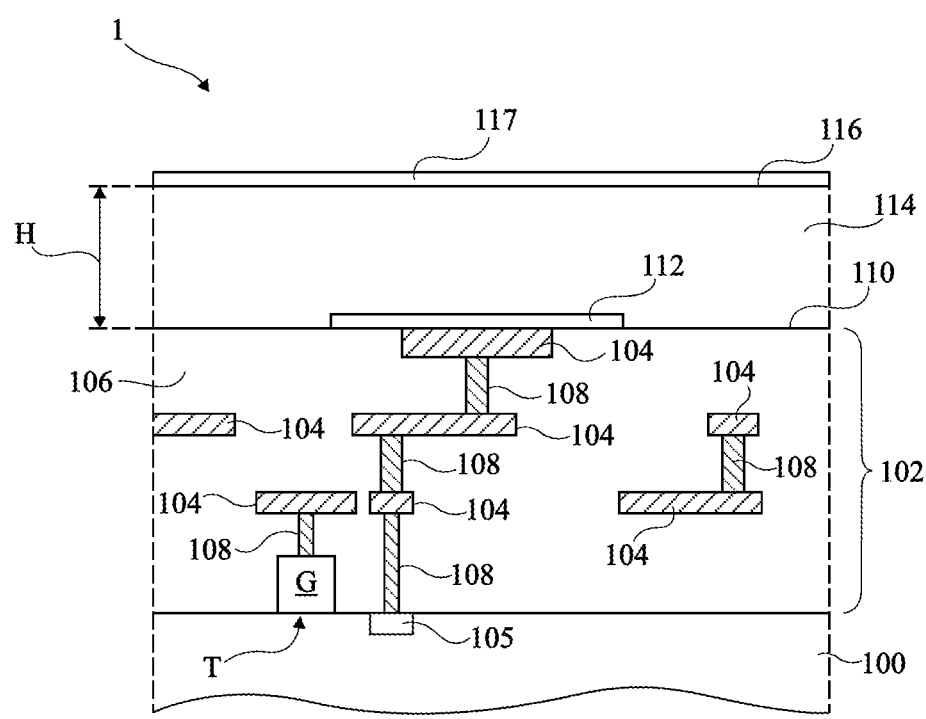
FIG. 1 shows, in a simplified cross-section view, an example of a pixel of a light sensor.

FIG. 1 shows in a simplified cross-section view an example of a pixel 1 of a light sensor, it being understood that, in practice, the sensor may comprise a plurality of identical pixels 1, for example several hundred or several thousand pixels 1.

The sensor comprises a semiconductor layer 100, for example a semiconductor substrate or a layer of a semiconductor on insulator structure, or SOI structure. Layer 100 is, for example, a silicon layer.

Various components in CMOS technology are formed inside and/or on top of layer 100. In other words, various CMOS components are formed from layer 100. In FIG. 1, a single one of these components is shown, in this example a transistor T only having its gate electrode G, also called gate stack or gate, shown in FIG. 1, on the layer 100 and including (not explicitly shown) regions of the layer 100 forming the source, drain, and channel of the transistor T.

Layer 100 and the CMOS components formed inside and/or on top of this layer 100 form an integrated circuit in CMOS technology of the sensor, or CMOS integrated circuit. As an example, the CMOS integrated circuit comprises circuits for reading the sensor pixels.

The sensor comprises an interconnection structure 102. Interconnection structure 102 covers the CMOS integrated circuit of the sensor, or, in other words, covers layer 100 and the CMOS components formed inside and/or on top of this layer 100. The upper surface 110 of interconnection structure 102 is planar.

Interconnection structure 102 comprises portions of electrically-conductive layers 104, for example portions of metal layers, embedded in electrically-insulated layers. In other words, these portions of conductive layers 104 are separated from one another by these insulating layers. In FIG. 1, the insulating layers of interconnection structure 102 are shown as a single insulating layer 106.

Interconnection structure 102 comprises electrically-conductive vias 108, for example metal vias, electrically coupling the portions of conductive layers 104 together and/or to CMOS components of the integrated circuit of the sensor.

Conductive vias 108 and the portions of conductive layers 104 form electrically-conductive elements of interconnection structure 102.

In addition to interconnection structure 102 and to the integrated CMOS circuit that it covers, pixel 1 comprises an electrically-conductive element 108 or 104 of interconnection structure 102 which is flush with the surface of the upper surface 110 of interconnection structure 102, that is, with the upper surface of insulating layer 106.

Preferably, as shown in FIG. 1, this conductive element is a conductive layer portion 104. Preferably, this conductive element is electrically coupled to a circuit for reading out pixel 1 comprising CMOS components such as transistor T, via other conductive elements 104, 108 of interconnection structure 102. For example, conductive element 104 flush with surface 110 is electrically coupled to a doped area 105 formed in layer 100 and forming a photogenerated charge storage area of the pixel.

Pixel 1 comprises an electrode 112. A central portion of electrode 112 rests on top of and in contact with the conductive element 104 flush with surface 110. Electrode 112 forms a lower electrode of pixel 1.

A photosensitive film 114 rests on interconnection structure 102. Film 114 covers interconnection structure 102 and electrode 112 of pixel 1. More particularly, film 114 rests on top of and in contact with the entire electrode 112 and on top of and in contact with all the portions of surface 110 which are not coated with electrode 112.

Film 114 has a planar upper surface 116. Between surface 110 and surface 116, film 114 has a thickness H.

Pixel 1 also comprises an upper electrode 117 resting on surface 116 of film 114.

In operation, when light at the operating wavelength of the sensor is received by pixel 1, electron-hole pairs are photogenerated in film 114. The photogenerated holes or electrons are then collected by electrode 112 to be transmitted to the CMOS integrated circuit for reading out pixel 1. The pixel readout circuit then supplies information representative of the quantity of light at the operating wavelength of pixel 1 which is received by this pixel 1.

The quantum efficiency QE of pixel 1 corresponds to the ratio of the number of photogenerated holes or electrons collected by pixel 1 to the number of photons received by pixel 1 at an operating wavelength of pixel 1. To increase the quantum efficiency of pixel 1, it would be desirable to increase thickness H of film 114.

However, the increase in thickness H of film 114 poses various problems. Indeed, an increase in the thickness of film 114 causes an increase in the risk of delamination of film 114 and/or an increase in the risk that cracks will form through all or part of the thickness of film 114. Further, an increase in the thickness of film 114 causes an increase in the number of steps of forming of film 114, for example, since film 114 is then formed by at least two successive depositions, which results in an increase in the manufacturing cost of pixel 1, and more generally of a light sensor comprising one or a plurality of pixels 1.

It is here provided to locally increase the thickness of the photosensitive film of a pixel of the type of pixel 1, above the lower electrode of the pixel, while keeping the upper surface of the photosensitive film planar, and while keeping, beyond the lower electrode, a thickness of the photosensitive film for which the risk of delamination or of cracking is null or almost null, this thickness depending on the type (number of layers, materials, etc.) of the implemented photosensitive film.

FIGS. 2 to 7 illustrate successive steps of an implementation mode of a method of manufacturing a pixel of a light sensor, resulting in the obtaining of a photosensitive film locally thicker above the lower electrode of the pixel. The pixel manufactured by this method comprises a CMOS integrated circuit similar or identical to that of pixel 1, and an interconnection structure 102 similar or identical to that of pixel 1, interconnection structure 102 resting on the CMOS integrated circuit.

Figure 2:
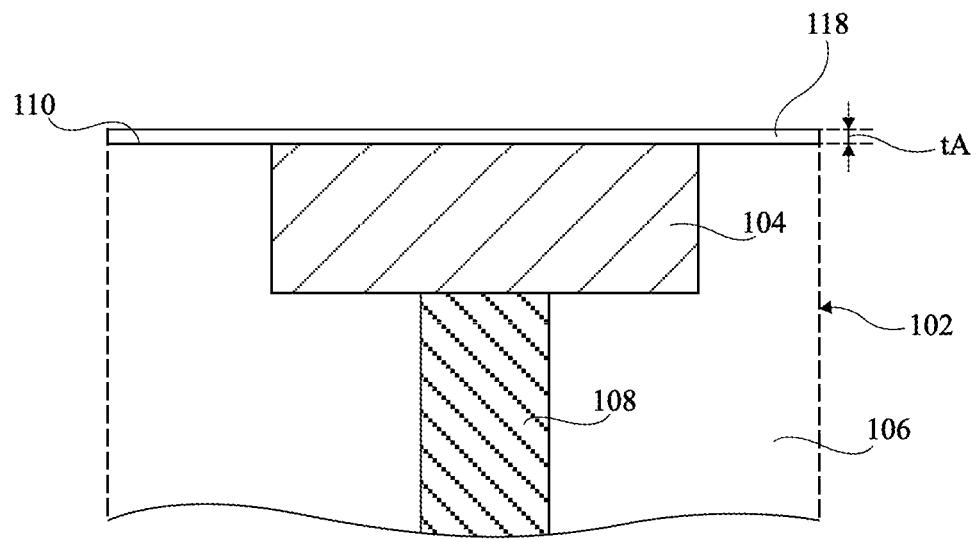
FIG. 2 illustrates, in a simplified cross-section view, a step of an implementation mode of a method of manufacturing a pixel of a light sensor.

FIG. 2 is a simplified cross-section view illustrating a step of the manufacturing method.

In FIG. 2, only a portion of interconnection structure 102 is shown. The shown portion of interconnection structure 102 comprises an electrically-conductive element 104 or 108 flush with the level of the upper surface 110 of interconnection structure 102. In other words, the upper surface of conductive element 104 forms part of the upper surface 110 of interconnection structure 102.

Preferably, as shown in FIG. 2, the conductive element flush with surface 110 is a conductive layer portion 104 of interconnection structure 102. Preferably, conductive element 104 is electrically coupled to a CMOS integrated circuit (not shown) having interconnection structure 102 resting thereon, for example, to a pixel readout circuit.

As an example, conductive element 104 is made of a metal such as copper or aluminum, or of a metal alloy such as an aluminum/copper alloy.

At the step of FIG. 2, a first electrode layer 118 has been deposited on surface 110 of interconnection structure 102, it being understood that, before the deposition of layer 118, surface 110 was an exposed surface of interconnection structure 102. Layer 118 is an electrically-conductive layer.

Layer 118 is more particularly deposited in contact with surface 110. For example, a lower surface of layer 118 is in contact with surface 110. Electrode layer 118 is thus deposited on top of and in contact with conductive element 104. Layer 118 entirely covers the upper surface of conductive element 104.

Preferably, layer 118 is deposited over the entire surface 110 of the interconnection structure or, in other words, is deposited full plate.

Layer 118 is, for example, deposited by chemical vapor deposition (CVD), or by atomic layer deposition (ALD), or by physical vapor deposition (PVD).

According to an embodiment, the deposition of layer 118 corresponds to the deposition of a single layer of a conductive material. Preferably, this material is a diffusion barrier material for the metal, particularly for the metal of conductive element 104. Layer 118 then forms a diffusion barrier layer. In other words, layer 118 comprises a diffusion barrier layer on top of and in contact with surface 110. Thus, layer 118 comprises a diffusion barrier layer on top of and in contact with conductive element 104, this barrier layer entirely covering the upper surface of conductive element 104.

According to another embodiment, the deposition of layer 118 corresponds to successive depositions of electrically-conductive layers, possibly made of different materials. Preferably, the first layer deposited on top of and in contact with surface 110 to form layer 118 is made of a diffusion barrier material for metal, particularly for the metal of conductive element 104. Layer 118 then comprises a diffusion barrier layer on top of and in contact with conductive element 104, this barrier layer entirely covering the upper surface of conductive element 104.

As an example, layer 118 comprises a tantalum layer and/or a tantalum nitride layer and/or a titanium nitride layer and/or a titanium layer.

When layer 118 comprises a diffusion barrier layer resting on top of and in contact with conductive element 104, the diffusion barrier layer is made of tantalum, of tantalum nitride and/or of titanium nitride and/or of titanium.

As an example, thickness to of layer 118, for example measured orthogonally to surface 110 and from this surface 110, is in the range from 10 nm to 100 nm, for example from 40 nm to 70 nm, for example equal to 50 nm.

Figure 3:
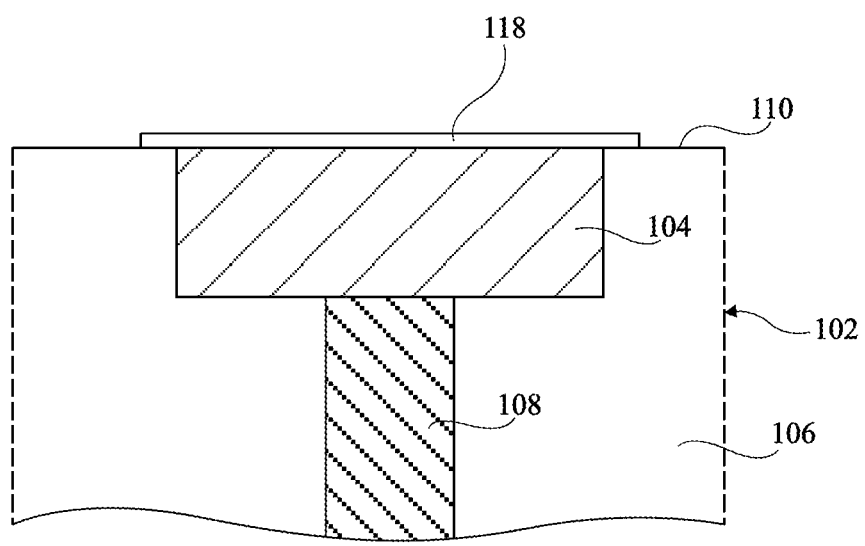
FIG. 3 illustrates, in a simplified cross-section view, another step of the pixel manufacturing method.

At the step of FIG. 3, an etching is performed down to surface 110 while leaving in place a portion of layer 118 entirely covering conductive element 104. In other words, portions of layer 118 which do not cover conductive element 104 are removed by etching down to surface 110, while leaving in place a portion of this layer 118 which entirely covers conductive element 104. The portion of layer 118 left in place and covering conductive element 104 may extend around conductive element 104 as shown in FIG. 3.

As an example, the etch step comprises the deposition of one or a plurality of etch masks, the definition of an etch mask by photolithography in the deposited layer(s), so that the etch mask entirely covers conductive element 104. Then, the etching, for example a dry or wet or plasma etching, is performed and the mask is then removed.

As a more specific example, when layer 118 comprises diffusion barrier layer made of tantalum and/or of tantalum nitride and/or of titanium nitride and/or of titanium, the etching is a plasma etching, such as a reactive ion etching (RIE) for example.

Figure 4:
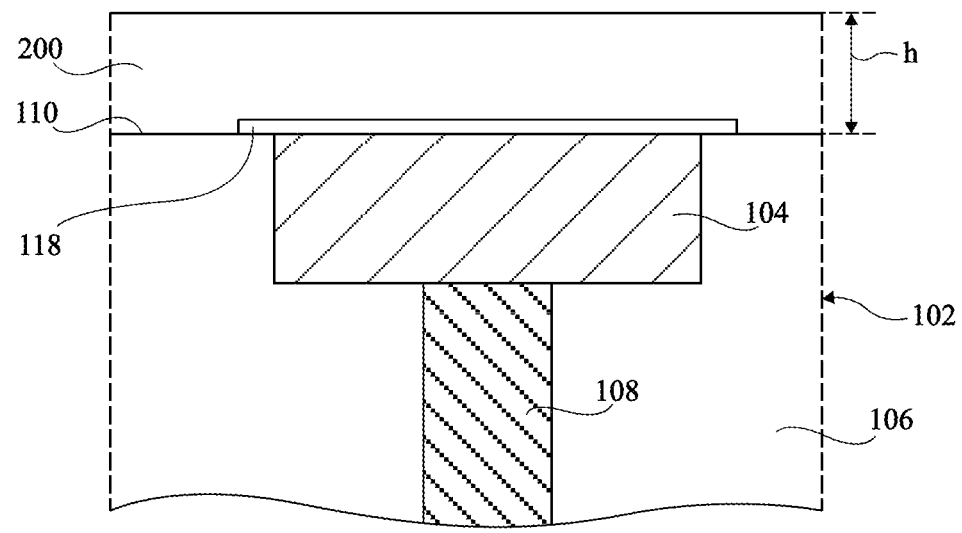
FIG. 4 illustrates, in a simplified cross-section view, still another step of the pixel manufacturing method.

At the step of FIG. 4, an insulating layer 200 has been deposited on the structure obtained at the end of the step of FIG. 3, on the side of surface 110. Preferably, layer 200 is deposited full plate. In other words, layer 200 is deposited on top of and in contact with the surface 110 of interconnection structure 102, and on top of and in contact with layer 118. Layer 200 entirely covers layer 118.

According to an embodiment, the deposition of layer 200 corresponds to the deposition of a single layer of an electrically-insulating material.

According to another embodiment, the deposition of layer 200 corresponds to successive depositions of layers made of electrically-insulating materials, possibly different between layers.

As an example, layer 200 is made of silicon nitride (for example, SiN or $Si_3N_4$) or corresponds to a stack of a silicon nitride layer resting on top of and in contact with surface 110 and layer 118, and of a silicon oxide (for example, SiO or $SiO_2$) layer resting on top of and in contact with the silicon nitride layer.

As an example, the thickness h of layer 200, for example measured orthogonally and from surface 110, is in the range from 50 nm to 500 nm, for example from 50 nm to 300 nm, for example equal to 200 nm.

Figure 5:
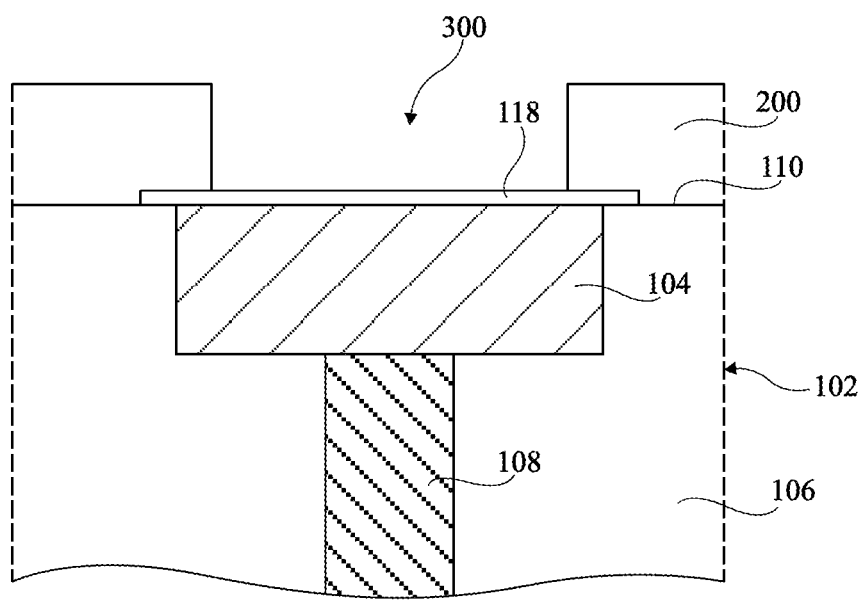
FIG. 5 illustrates, in a simplified cross-section view, still another step of the pixel manufacturing method.

At the step of FIG. 5, an opening 300 is etched through layer 200, down to layer 118. In other words, the etching of opening 300 is stopped on layer 118. After the etching of opening 300, a portion at least of layer 118 is exposed at the bottom of opening 300 (at the bottom of opening 300 in FIG. 5).

Opening 300 is etched to only emerge onto layer 118 (i.e., expose an upper surface of the layer 118), which may then advantageously be used as an etch stop layer.

Opening 300 is etched opposite conductive element 104, so that the portion of layer 118 exposed by the etching of opening 300 corresponds to a portion of layer 118 resting on top of and in contact with conductive element 104.

As an example, opening 300 has lateral dimensions, for example a diameter in the case where opening 300 has a circular shape in top view or a side length in the case where opening 300 has a square shape in top view, which are smaller than or equal to one third of the lateral dimensions of the manufactured pixel. The lateral dimensions of the pixel and of opening 300 are, for example, measured in a plane parallel to surface 110. For example, in a light sensor where the pixels are arranged regularly with a pitch in the order of 3 µm, that is, each pixel has lateral dimensions in the order of 3 µm, the opening 300 of each pixel of the sensor has lateral dimensions smaller than or equal to 1 µm.

Figure 6:
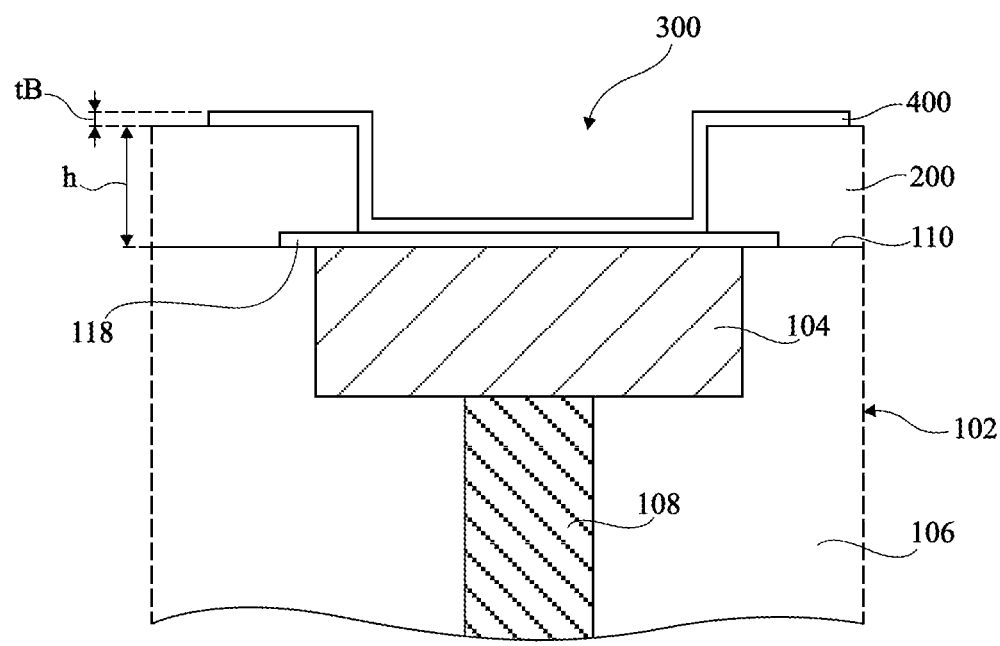
FIG. 6 illustrates, in a simplified cross-section view, still another step of the pixel manufacturing method.

At the step of FIG. 6, a second electrode layer 400 is deposited on the structure obtained at the end of the step described in relation with FIG. 5. In other words, electrode layer 400 is deposited on top of and in contact with, on the one hand, layer 118, and more exactly the portion of layer 118 exposed at the bottom of opening 300 and, on the other hand, insulating layer 200, particularly on top of and in contact with the lateral walls of opening 300.

Preferably, layer 400 is deposited full plate. Layer 400 is, for example, deposited by chemical vapor deposition (CVD), or by atomic layer deposition (ALD), or by physical vapor deposition (PVD).

The thickness tB of electrode layer 400 is smaller than the thickness h of layer 200, so that layer 400 does not fill opening 300. As an example, the thickness tB of layer 400 is ten times smaller than that of layer 200. As an example, the thickness tB of layer 400 is in the range from 5 to 100 nm.

According to an embodiment, the deposition of layer 400 corresponds to the deposition of a single layer of an electrically-conductive material, for example a metal or a metal alloy or a conductive metal alloy.

According to another embodiment, the deposition of layer 400 corresponds to successive depositions of layers, each being made of an electrically-conductive material, for example a metal or a metal alloy or a conductive metal oxide, possibly different between these successively deposited layers.

After the deposition of layer 400, portions of layer 400 resting on layer 200 are removed by etching. More exactly, portions of layer 400 resting on the upper surface of layer 200 are removed by etching while leaving in place a portion of layer 400 resting on layer 118, on the lateral walls of opening 300 and overlapping layer 200 around opening 300. The portion of layer 400 left in place then comprises a ring-shaped portion extending laterally from opening 300, and resting on top of and in contact with the upper surface of layer 200.

As an example, the etch step comprises the deposition of one or a plurality of etch mask layers, the definition of an etch mask by photolithography or the deposited layer(s), so that the etch mask entirely covers a portion of layer 400 resting on layer 118, on the lateral walls of opening 300 and overlapping layer 200 around opening 300. Then, the etching, for example a plasma etching, is carried out, and the mask is then removed.

At the end of the step of FIG. 6, layers 118 and 400, and more exactly the portion of layer 118 left in place at the step of FIG. 3 and the portion of layer 400 left in place at step 6, are in contact with each other at the bottom of opening 300 and form a lower electrode of the pixel.

According to an embodiment, the material(s) of layer 400 are selected to adapt the work function of this lower electrode according to the charges (electrons or holes) collected by this electrode. This enables to improve the extraction of the charges photogenerated in the photosensitive film (not shown at this step) which, at the end of the method, covers layer 400. More particularly, layer 400 comprises a layer, called charge extraction layer, made of a material configured to adapt the work function of the lower electrode, for example made of zinc oxide (ZnO) or of aluminum zinc oxide (AZO). The charge extraction layer has, for example, a surface confounded with the surface of layer 118 opposite to the surface of layer 118 resting on conductive element 104.

Figure 7:
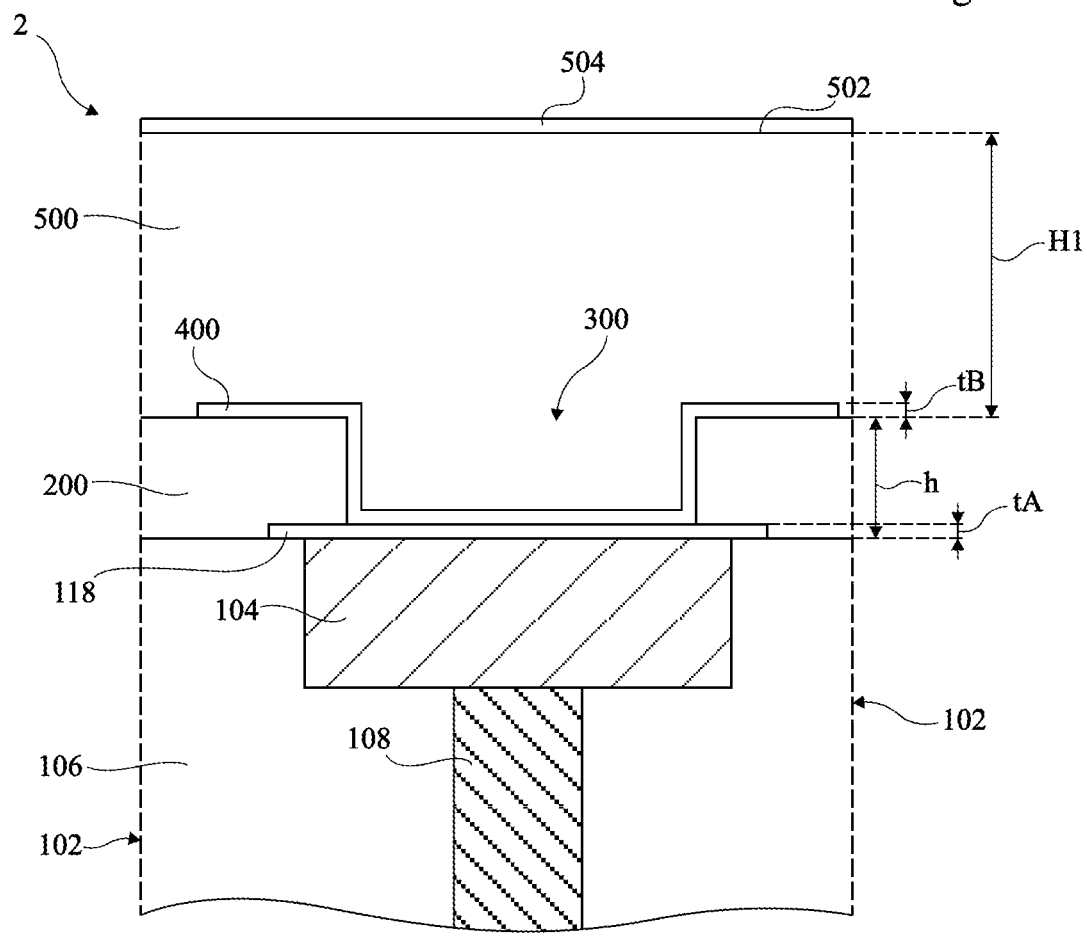
FIG. 7 illustrates, in a simplified cross-section view, still another step of the pixel manufacturing method.

At the step of FIG. 7, a photosensitive film 500 is deposited on the structure obtained at the end of the steps of FIG. 6. When layer 400 comprises a charge extraction layer, film 500 is deposited on top of and in contact therewith.

Photosensitive film 500 is deposited full plate, to cover layer 400, and the exposed portions of the upper surface of layer 200.

The method of deposition of film 500 results in the obtaining of a film 500 having a planar upper surface, or exposed surface, 502.

Film 500 is deposited so that its thickness H1, for example measured orthogonally to the upper surface of interconnection structure 102, from the upper surface of layer 200 to the upper surface 502 of film 500, is smaller than or equal to a maximum thickness beyond which delaminations and/or cracks may occur in film 500. This maximum thickness may be determined by those skilled in the art, for example from routine tests, and particularly depends on the material of film 500 and/or on the implemented method of deposition of film 500.

Further, thickness H1 of film 500 is greater than thickness h of layer 200, so that film 500 entirely fills opening 300. Preferably, thickness H1 of film 500 is greater than at least 2 times thickness h of layer 200. As an example, thickness H1 of film 500 is in the range from 200 nm to 1 µm, for example equal to approximately 500 nm.

According to the material of film 500, the full plate deposition of film 500 may be performed, for example by a liquid deposition, by a cathode sputtering deposition, by a vapor deposition, by spin coating, by spray coating, by heliography, by slot-die coating, by blade coating, by flexography, or by silk-screening. An example of spray deposition is described in the reference Kramer et al., "Efficient Spray-Coated Colloidal Quantum Dot Solar Cells", Adv. Mater., 27: 116-121 (incorporated herein by reference).

According to the targeted thickness H1 and/or to the form in which the material of film 500 is deposited, for example, according to whether the material is deposited in the form of ink or of a colloidal solution stabilized by intermediate ligands, the deposition of film 500 is implemented by a single deposition step, or by a plurality of successive deposition steps, where each deposition step may be followed by a chemical treatment step and/or an anneal or drying step.

As an example, the material of film 500 is deposited in the form of ink, for example, by a plurality of successive steps of deposition of the material of film 500.

Each step of deposition of the material of film 500 in the form of ink results in the obtaining of a layer of the material of film 500 having a thickness in the range, for example, from approximately ten nanometers to one or a plurality of hundred nanometers, the thickness for example depending on the concentration of the deposited ink.

Each step of deposition of the material of film 500 in the form of ink is, for example, implemented at a temperature in the range from 0° C. to 50° C., preferably from 10° C. to 25° C.

As an example, no chemical treatment is implemented after each step of deposition of the material of film 500 in the form of ink.

As an example, each step of deposition of the material of film 500 in the form of ink is followed by an anneal, for example at a temperature in the range from 40° C. to 150° C., for example at a 100° C. temperature. This anneal, for example, has a duration in the range from one or a plurality of tens of seconds to one or a plurality of hours. This anneal is, for example, implemented on a heating plate or in an oven. This anneal is, for example, implemented under an ambient atmosphere, under a controlled atmosphere, or under vacuum.

As an example, the material of film 500 is deposited in the form of a colloidal solution stabilized by intermediate ligands, for example, by a plurality of successive steps of deposition of this stabilized colloidal solution.

Each step of deposition of a layer of colloidal solution stabilized by intermediate ligands is, for example implemented at a temperature in the range from 0 to 50° C., for example at a temperature of 15, 25, or 30° C.

Each step of deposition of the material of film 500 in the form of a colloidal solution stabilized by intermediate ligands is, for example, followed by one or a plurality of chemical treatment steps to modify the properties of the film of deposited solution, for example to modify the conductivity properties of the film for electrons and/or holes. For example, each deposited layer of colloidal solution stabilized by intermediate ligands is placed into contact with chemical solutions which interact with the deposited layer, to cause exchanges in solid phase of the intermediate ligands present around nanocrystals forming quantum dots, by molecules enabling to improve properties of film 500. These molecules are, for example, ligand chains shorter than those of the intermediate ligands, which enables to increase the conductivity of film 500, and/or inorganic molecules, which enables to increase the resistance and/or the stability of film 500 with respect to its environment (air, light). These solid phase chemical exchanges are, for example, implemented by a plurality of successive steps of placing into contact of a chemical solution with the deposited layer of colloidal solution, each chemical solution being a solution comprising ligands or inorganic molecules, for example, intended to be exchanged with intermediate ligands of the deposited layer of colloidal solution.

As an example, each chemical solution is placed into contact with the deposited layer of colloidal solution for a duration in the range from between one and ten seconds to between one and ten minutes, for example for a duration of 90 seconds.

As an example, rinsing steps may be provided between two successive steps of placing into contact of a chemical solution with the deposited layer.

As an example, one or a plurality of intermediate anneal steps (between two successive steps of placing into contact of a solution with the deposited layer) and/or a final anneal step may be provided. The temperatures of the anneal steps are, for example, in the range from 40° C. to 150° C. The duration of each anneal step is, for example, in the range from approximately 10 s to one or a plurality of hours. Each anneal step is, for example, implemented on a heating plate, for example under an ambient atmosphere, under a controlled atmosphere, or under vacuum, or in an oven, for example under a controlled atmosphere.

The efficiency of the solid phase chemical exchanges limits the maximum thickness of each deposited layer of stabilized colloidal solution, this maximum thickness being determined so that the entire volume of the deposited layer of stabilized colloidal solution is submitted to solid phase chemical exchanges with the chemical elements of interest of the chemical solutions placed in contact with this layer. As an example, the thickness of each deposited layer of stabilized colloidal solution is in the range from a few nanometers, for example from 3 to 5 nm, to a few hundred nanometers, for example from 300 to 500 nm. As an example, the thickness of each deposited layer of stabilized colloidal solution is equal to approximately 50 nm.

According to an embodiment, film 500 is a colloidal quantum dot film or, in other words, film 500 comprises colloidal quantum dots. An upper surface 502 of film 500 is planar.

An electrode 504 is then formed on top of and in contact with film 500. Electrode 504, called upper electrode of the pixel, is formed by the deposition of one or a plurality of conductive layers having upper electrode 504 defined therein, for example, by etching. Each conductive layer forming part of upper electrode 504 is partially transparent to the operating wavelength(s) of the pixel. As an example, the upper electrode is made of indium tin oxide or ITO.

A pixel 2 comprises a lower electrode formed of electrode layers 118 and 400. In this pixel 2, layer 118 is in contact with conductive element 104 and covers the upper surface thereof, and layer 400 is interposed between layer 118 and film 500, with which layer 400 is in contact.

From the structure shown in FIG. 7, steps, not shown, may be implemented.

Conventionally, one or a plurality of passivation layers (not shown in FIG. 7) and/or one or a plurality of insulating layers (not shown in FIG. 7) and/or one or a plurality of color filters (not shown in FIG. 7) and/or one or a plurality of lenses or microlenses (not shown in FIG. 7) may be formed above the film 500 and the upper electrode 504 of the pixel.

As shown in FIG. 7, in pixel 2, above the portion of the lower electrode which rests on conductive element 104, that is, above the portion of layer 400 which is opposite conductive element 104, the total thickness of film 500 is equal to H1+h-to-tB. Thus, if thickness H1 of film 500 is equal to thickness H of the film 114 of the pixel 1 described in relation with FIG. 1, the film 500 of pixel 2 is locally thicker than film 114 while keeping the planar upper surface 502. This overthickness of film 500, located above the lower electrode of pixel 2, results in an increase in the quantum efficiency of pixel 2 with respect to pixel 1.

Further, the above-described method allows the etching of layer 118 of the lower electrode of pixel 2, such as described at the step of FIG. 3, to be different from the etching of the layer 400 of this lower electrode, such as described at the step of FIG. 6. This enables to use a less aggressive etching to etch layer 400 than that used to etch layer 118, for example, in particular when the materials of layer 118 are more difficult to etch than the materials of layer 400 and/or when the materials of layer 400 are more sensitive to the etch steps than the materials of layer 118. This is particularly true when layer 118 comprises a diffusion barrier layer and the material(s) of layer 400 are selected to obtain a work function enabling to optimize the quantum efficiency of pixel 2. Indeed, the materials of layer 118 then require an etching which would damage the materials of layer 400, that is, an etching poorly adapted to the etching of layer 400, which would result in decreasing the quantum efficiency of pixel 2.

The provision of a layer 400, for example made of or comprising ZnO and/or AZO, to optimize the work function of the lower electrode of pixel 2, enables to decrease the potential difference applied between upper electrode 504 and lower electrode 118, 400 when pixel 2 is in operation, as compared with that to be applied between electrodes 112 and 117 of pixel 1 (FIG. 1) when the latter is in operation. Beyond the resulting consumption decrease, the decrease in the potential difference applied to film 500 results in a better time behavior of film 500 and thus in a better reliability of pixel 2.

According to an embodiment, the dimensions of the conductive element 104 of pixel 2 which is flush with surface 110 are selected according to the lateral dimensions of opening 300 etched at the step of FIG. 3. For example, these dimensions are selected so that, at the step illustrated in relation with FIG. 3, by adapting the location of opening 300 with respect to the location of conductive element 104, the entire opening 300 is located opposite conductive element 104. However, as a variant, when conductive element 104 flush with surface 110 has lateral dimensions, for example measured in a plane parallel to surface 110, smaller than those of opening 300, the dimensions of the portion of layer 118 left in place at the step of FIG. 3 are set so that opening 300 emerges on layer 118 only.

Further, according to an embodiment, at the step of FIG. 5, opening 300 is etched in a central portion of pixel 2 in top view. Thus, when the electromagnetic radiations received by pixel 2 are focused in a central portion of film 500 in top view, for example, by one or a plurality of lenses or microlenses, these radiations are focused into a portion of film 500 having a total thickness equal to H1+h-tA-tB.

According to an embodiment, thickness h of layer 200 and thickness tA of layer 118 are selected so that thickness h minus thickness tA is equal to half the wavelength, in film 500, of an incident radiation of pixel 2. Thus, when pixel 2 receives electromagnetic radiations at this wavelength, this enables to obtain constructive interferences between, on the one hand, an electromagnetic radiation which has crossed film 500 and which has been reflected on the portion of layer 400 arranged at the bottom of opening 300 and, on the other hand, an electromagnetic radiation which has crossed film 500 and which has been reflected on a portion of layer 400 resting on the upper surface of layer 200.

According to an embodiment, one or a plurality of operating wavelengths of pixel 2 are in the near infrared range and are, for example, in the range from 750 nm to 3,000 nm. For example, pixel 2 has an operating wavelength equal to 940 nm. It will be within the abilities of those skilled in the art to adapt thicknesses tA, tB, H1 and/or h, and/or the material(s) of film 500, of layer 118, and/or of layer 400 to the operating wavelength(s) of pixel 2. For example, in the case where film 500 comprises colloidal quantum dots, according to the operating wavelength of pixel 2, it will be within the abilities of those skilled in the art to adapt the dimensions and the composition of nanocrystals forming the colloidal quantum dots.

It has been observed that the quantum efficiency of a pixel 2 was up to 30%, or even 35% higher than the quantum efficiency of a corresponding pixel 1, that is, a pixel 1 having its film 114 made of the same material as the film 500 of pixel 2 and having a thickness H equal to thickness H1 of film 500 of pixel 2. For example, the inventors have measured a quantum efficiency in the order of 0.6 electron per incident photon for a pixel 2, and in the order of 0.45 electron per incident photon for a corresponding pixel 1.

Although implementation modes and variants of a method of manufacturing a single pixel 2 have been described hereabove in relation with FIGS. 2 to 7, a plurality of identical pixels 2, for example of a same light sensor or of a plurality of light sensors, may be manufactured simultaneously from a same semiconductor layer or wafer 100 (FIG. 1), by simultaneously implementing the described steps for all these pixels 2. The pixels 2 thus manufactured can then share a same film 500.

Various embodiments, implementation modes and variants have been described. Those skilled in the art will understand that certain features of these various embodiments, implementation modes, and variants, may be combined and other variants will occur to those skilled in the art. In particular, although a pixel 2 where the conductive element of interconnection structure 102 which is in contact with layer 118 is a portion of conductive layer 104 has been described, it will be within the abilities of those skilled in the art to adapt the described method to the case where this conductive element is a via 108.

Finally, the practical implementation of the described embodiments, implementation modes, and variants is within the abilities of those skilled in the art based on the functional indications given hereabove. In particular, it will be within the abilities of those skilled in the art to select the material(s) of film 500 according to the targeted application, and/or to determine, for a given film 500, the maximum value of thickness H1 from which delaminations and/or cracks may form in film 500. Further, it will be within the abilities of those skilled in the art to form the photolithography masks enabling to form etch masks for the implementation of the previously-described etch steps.

The invention claimed is:

1. A method of manufacturing a pixel, comprising the successive steps of:
    depositing a first electrode layer on an exposed surface of an interconnection structure of an integrated circuit and in contact with a conductive element of the interconnection structure which is flush with said exposed surface;
    depositing an insulating layer over the first electrode layer;
    forming an opening crossing through the insulating layer to an upper surface of the first electrode layer;
    depositing a second electrode layer on top of and in contact with the upper surface of the first electrode layer and lateral walls of the opening crossing through the insulating layer;
    removing a portion of the second electrode layer resting on an upper surface of the insulating layer; and
    depositing a film on top of the insulating layer, the second electrode layer and filling the opening, wherein a portion of said film in the opening is located where radiation at an operating wavelength of the pixel is focused and received, and wherein said portion is configured to convert photons into electron-hole pairs.

2. The method according to claim 1, further comprising, before depositing the insulating layer, etching said first electrode layer down to said surface while leaving in place a portion of the first electrode layer entirely covering the conductive element.

3. The method according to claim 1, wherein a portion of the upper surface of the first electrode layer exposed by forming the opening and the lateral walls of the opening are entirely covered with the second electrode layer.

4. The method according to claim 1, wherein the film is deposited so that an upper surface of the film is planar.

5. The method according to claim 4, further comprising forming a third electrode layer on the upper surface of said film, wherein said third electrode layer is made of a material which is transparent to light at said operating wavelength.

6. The method according to claim 1, wherein said film comprises colloidal quantum dots.

7. The method according to claim 1, wherein a thickness of the insulating layer minus a thickness of the first electrode layer is equal to half of said operating wavelength.

8. The method according to claim 1, wherein said operating wavelength is in a range from 750 nm to 3,000 nm.

9. The method according to claim 1, wherein said operating wavelength is substantially equal to 940 nm.

10. The method according to claim 1, wherein the first electrode layer comprises a diffusion barrier layer on top of and in contact with the conductive element.

11. The method according to claim 1, wherein the second electrode layer comprises a charge extraction layer in contact with said film.

12. The method according to claim 1, wherein the second electrode layer is thinner than the insulating layer.

13. The method according to claim 1, wherein the film is thicker than the insulating layer.

14. A method of manufacturing a pixel, comprising the successive steps of:
  depositing a first conductive layer on an upper surface of an interconnection structure;
  depositing an insulating layer over the first conductive layer;
  forming an opening crossing through the insulating layer to an upper surface of the first conductive layer;
  depositing a second conductive layer within the opening in contact with the upper surface of the first conductive layer and lateral walls of the opening;
  depositing a film filling the opening and in contact with the second conductive layer;
  depositing a third conductive layer on the film;
  wherein a portion of said film in the opening is located where radiation at an operating wavelength of the pixel is focused and received, and wherein said portion is configured to convert photons into electron-hole pairs.

15. The method of claim 14, wherein the interconnection structure includes a conductive element and wherein the first conductive layer is electrically connected to the conductive element.

16. The method of claim 14, wherein said film comprises colloidal quantum dots.

17. The method of claim 14, wherein a thickness of the insulating layer minus a thickness of the first conductive layer is equal to half of said operating wavelength.

18. The method of claim 14, wherein said operating wavelength is in a range from 750 nm to 3,000 nm.

19. The method of claim 14, wherein said operating wavelength is substantially equal to 940 nm.

20. The method of claim 14, wherein the first conductive layer comprises a diffusion barrier layer.

21. The method of claim 14, wherein the second conductive layer comprises a charge extraction layer.

22. The method of claim 14, wherein the second conductive layer is thinner than the insulating layer.

23. The method of claim 14, wherein the film is thicker than the insulating layer.

24. The method of claim 14, wherein the third conductive layer is made of a material which is transparent to light at said operating wavelength.

* * * * *